United States Patent [19]

Murphy

[11] Patent Number: 4,654,587
[45] Date of Patent: Mar. 31, 1987

[54] DIGITAL PEAK DETECTOR AND METHOD OF PEAK DETECTION

[75] Inventor: Hugh J. Murphy, Huntington Beach, Calif.

[73] Assignee: Rockwell International Corporation, El Segundo, Calif.

[21] Appl. No.: 770,947

[22] Filed: Aug. 30, 1985

[51] Int. Cl.$^4$ ............... G01R 19/16; H03K 5/153
[52] U.S. Cl. .......................... 324/103 P; 307/351
[58] Field of Search ............ 324/103 P, 102; 307/351, 359, 360; 328/150

[56] References Cited

U.S. PATENT DOCUMENTS

| 3,984,772 | 10/1976 | Buhler et al. | 324/103 P |
| 4,018,990 | 4/1977 | Long et al. | 358/149 |
| 4,183,016 | 1/1980 | Sawagata | 340/347 AD |
| 4,237,387 | 12/1980 | Devendorf et al. | 307/203 |
| 4,386,339 | 5/1983 | Henry | 340/347 AD |

FOREIGN PATENT DOCUMENTS

| 0052956 | 9/1980 | Japan | 324/103 P |
| 0214774 | 12/1984 | Japan | 324/103 P |
| 0703766 | 12/1979 | U.S.S.R. | 324/102 |

OTHER PUBLICATIONS

Collins et al; "High Speed Sampling Voltmeter"; vol. 9, No. 12; May 1967; pp. 1814–1815.

Primary Examiner—Ernest F. Karlsen
Assistant Examiner—Vinh P. Nguyen
Attorney, Agent, or Firm—Jonathan B. Orlick; George A. Montanye; H. Fredrick Hamann

[57] ABSTRACT

A high-speed digital peak detector for determining the peak voltage of an input analog signal and for providing a one of N unary digital output corresponding to the peak voltage, where N is a positive integer, comprising a plurality of N self-latching voltage detectors in a flash-encoding or parallel encoding arrangement, each detector comprising a latchable differential voltage comparator and an Exclusive/Or gate, each of the comparators and gates having first and second input terminals and first and second output terminals and each of the comparators further having first and second latch function input terminals. The second output terminal of each of the comparators is connected to the first input terminal of a corresponding one of the gates, and the first and second output terminals of the corresponding one of the gates is connected, respectively, to the first and second latch function input terminals of the corresponding one of the comparators. A reset signal is coupled to the second input terminal of each of the gates and a standard voltage is coupled to the second input terminal of each of the comparators. A step difference from one standard voltage to the next is maintained which is substantially equal to a one/(N+1) part of the entire expected range of the input analog signal, the analog input signal being applied in parallel to the first input terminal of each of the comparators, and a one of N unary digital output being provided collectively at the N first output terminals of each of the N comparators corresponding to the peak voltage of the input analog signal.

8 Claims, 9 Drawing Figures

DIGITAL PEAK DETECTOR AND METHOD OF PEAK DETECTION

This invention was made with Government support under Contract No. F04704-78-C-0021 awarded by the Air Force. The Government has certain rights in this invention.

Related inventions are disclosed in U.S. patent application Ser. No. 452,602 now abandoned 2/13/86 entitled "Transient Detector Apparatus" by Lapeyrolerie, et al, filed Dec. 23, 1982, in which the Government is the assignee and U.S. application Ser. No. 599,406 filed Apr. 12, 1984, now U.S. Pat. No. 4,585,990, entitled "Largest Amplitude Transient Detector" by Murphy. These two applications are of interest in that they, along with the present application, all relate to the general field of peak detection and one inventor, Hugh J. Murphy, is either a joint or sole inventor on all three applications.

The '602 application concerns a detector apparatus which utilizes a slope detector and a peak detector to measure transient signals that occur in the normal dynamic range of a logic voltage signal. The slope detector determines the slope of the input logic signal. The peak detector determines and stores the peak value of the input signal and is controlled by a control unit. If the slope of the input logic signal crosses the 90% point of the full scale logic signal before a slope reversal occurs, the slope detector indicates a normal logic transition and signals the control unit to discard the peak level which is stored in the peak detector. When a transient signal is detected, the control unit sends the peak value in the peak detector to a digitizer unit where the peak value is converted to digital form and then outputted.

The '406 application relates to an apparatus for detecting the amplitude and pulse width of both positive and negative going input analog signals and generating a digital output corresponding to those measured values. This apparatus is capable of taking the worst case, i.e., maximum and/or minimum peak amplitudes and pulse widths and discarding the other cases during a given time interval. The apparatus incorporates the use of a slope detector. The input to the this transient detector is signal conditioned and converted to an 8-bit word and then processed by three sections.

BACKGROUND OF THE INVENTION

1. Field of the Invention

This invention has to do with self-latching peak detectors and more particularly, is concerned with high-speed peak detectors providing a digital output. Apparatus and method are provided to achieve accurate determination of peak voltage values for very narrow pulses with the capability of fast reset.

2. The Prior Art

Present methods of measuring the peak amplitude of a very narrow pulse involve the use of analog peak voltage detectors and/or very high speed analog to digital converters (ADC's). The analog peak voltage detector suffers from circuit complexity and drift errors. Also, it is very difficult to reset at high rates. Further, if post-conversion signal processing is required, the output of the analog peak voltage detector must first be converted to a digital word. The maximum conversion speed is on the order of 100 MHZ. Direct digital sampling without peak detection using high-speed ADC's would eliminate the analog peak detector problems but accurate detection would be limited to approximately 10 MHZ.

SUMMARY OF THE INVENTION

It is therefore a primary object of this invention to provide a high speed digital peak detector for determining the peak voltage of an input analog signal and providing a digital output corresponding to the peak voltage.

It is another object of this invention to provide a self-latching pulse amplitude detector for detecting the peak voltage of an input pulse relative to the voltage of a standard signal and for providing a resettable self-latched binary output signal corresponding to the peak voltage.

It is also an object of the present invention to provide a method for resettably self-latching a high speed voltage comparator used to compare the level of an input signal to that of a standard signal.

These and other objects are achieved in an apparatus and a method of the present invention. A basic feature of the present invention concerns an Exclusive/Or gate used to feed back a latching signal to a latchable voltage comparator where the comparator is used to level detect the peak voltage of an input signal relative to a standard signal.

BRIEF DESCRIPTION OF THE DRAWINGS

The invention will be further described as to the illustrative embodiments thereof in conjunction with the attached drawings, in which.

DESCRIPTION OF THE PREFERRED EMBODIMENT

Figure 1:
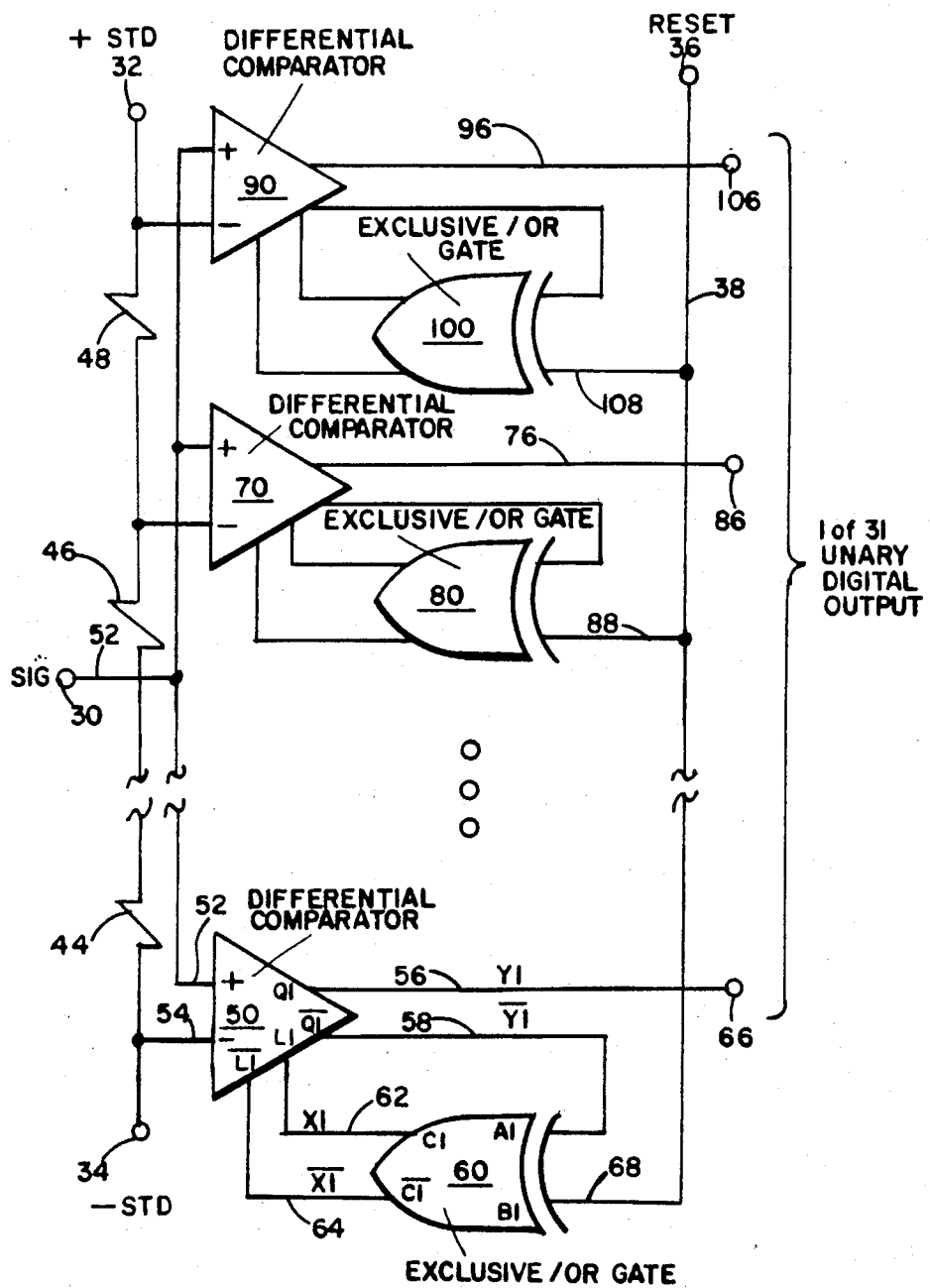
FIG. 1 is a block diagram of a high-speed digital peak detector according to the present invention, incorporating a plurality of 31 self-latching voltage detectors.

FIG. 1 presents a portion of a 1 of 31 unary digital peak detector embodying the present invention. There are shown three sections of a total of 31 sections which together provide the capability of detecting the peak amplitude of a high-speed pulse introduced to the circuit at an input terminal 30. The output from this digital peak detector is provided at the right-hand side of the diagram collectively at 31 different terminals, three of which are shown, terminals 66, 86, and 106. Each section comprises two key elements plus a standard signal source and the necessary interconnection between the elements. These elements are a latchable differential comparator 50 and an Exclusive/Or gate 60. A standard signal is provided through a resistive divider network between terminals 32 and 34, the typical divider network resistors being shown at 44, 46, and 48. Typically, a DC potential is placed across terminals 34 and 32, with a voltage spread between terminals 34 and 32 corresponding to the expected dynamic range of the input signal SIG applied at input terminal 30. Signal SIG applied to terminal 30 could be an analog pulse signal, the circuit then being used to determine the peak amplitude of this pulse relative to the voltage levels provided at the "−" terminals of differential comparators 50, 70, and 90.

Other than the difference in standard signal applied to the differential comparators, each of the 31 sections of which three are shown, are substantially identical in element and in hookup. It suffices then to provide a detailed explanation of one section it being understood that the description is applicable to any of the other 30 sections, of which two other typical sections are shown.

Referring to the bottom of FIG. 1, there is shown differential comparator 50 which has "+" and "−" input terminals to which are connected leads 52 and 54, respectively. The input analog signal is applied at 30 and connected to the differential comparator 50 through lead 52. The standard signal against which the analog input signal is to be compared is applied via the resistive divider network connected between terminals 32 and 34 and lead 54. This standard signal is applied to the "−" input terminal of differential comparator 50. Differential comparator 50 provides a logic signal at terminal Q1 and its logical complement at terminal $\overline{Q1}$. An output signal Y1 is provided over lead 56 to the output terminal 66. A complementary logic signal $\overline{Y1}$, is provided at terminal $\overline{Q1}$ over lead 58 to an input A1 of the Exclusive/Or gate 60. A reset signal is applied to a terminal B1 of Exclusive/Or gate 60 via leads 38 and 68 from a terminal 36 which in turn is connected to a source for reset signals which in this case is not shown. The output signals X1 and $\overline{X1}$ from Exclusive/or gate 60 are complementary logic signals which are provided via leads 62 and 64, respectively, to a pair of latch input terminals L1 and $\overline{L1}$, respectively, of differential comparator 50. Signals X1 and $\overline{X1}$ are provided at terminals C1 and $\overline{C1}$ of Exclusive/Or gate 60.

In similar fashion, the other 30 sections of this 1 of 31 unary digital peak detector are provided much as is shown in the upper portion of FIG. 1 which represent the last two digits of the collective output. For example, differential comparator 70 and an Exclusive/Or gate 80 together provide the 30th unary digit, and differential comparator 90 and an Exclusive/Or gate 100 together provide the 31st unary digit. The sections between the first section at the bottom and the 30 and 31st section at the top of FIG. 1 are identical to those shown and are connected in similar fashion.

The general concept presented here is that of a "flash encoder" or a "parallel encoder" wherein each of the 31 sections comprises a self-latchable differential comparator which compares the same input signal against a progressively increasing or decreasing standard signal level. In the typical application, the discrete standard signals levels are linearly distributed from a lowest to a highest potential level where the range of levels corresponds to the expected dynamic range of the input signal amplitude. A resistive ladder network of equal valued resistances connected between voltage extremes encompassing the desired dynamic range can be used to provide this linear distribution of standard signals. Such a ladder network is shown in FIG. 1, wherein resistors 44, 46, and 48 are typical ladder elements. For example, if the extreme voltages are applied at terminals 32 and 34, and each of the 31 sections is to have a standard signal which is approximately equally distant voltagewise from its neighboring section, then resistors such as 44, 46, and 48 are selected to be of equal value and will provide a step-wise different potential in comparison to its neighboring sections to each of the "−" terminals of the differential comparators 50, 80, 100. The input signal at terminal 30 is applied simultaneously to all 31 comparators in parallel fashion at each of their respective "+" terminals. For each of the differential comparators the voltage applied to terminal 30 is either greater than or less than the respective standard signal applied to the respective "−" terminal. If, for a given comparator, the amplitude of the input signal is greater than the standard signal, then the output, such as Y1 on lead 56 presented at terminal 66, will be a logic "1" output to indicate the condition that the voltage applied on lead 52 is greater than the potential applied on lead 54. Similarly, this comparison takes place simultaneously in each of the 31 sections with the net result being collectively presented at the output terminals such as terminals 66, 86, and 106. The function of the Exclusive/Or gates such as 60, 80, and 100 is to automatically provide a releasable self-latching signal to a latching input of the differential comparator such as at L1.

Figure 2:
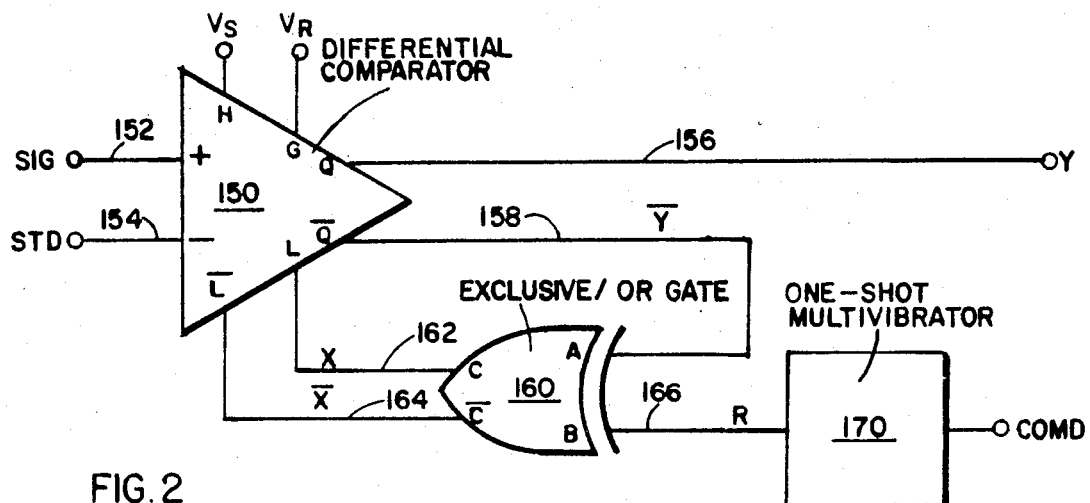
FIG. 2 is a detailed block diagram of a self-latching voltage detector of the present invention.

FIG. 2 is a block diagram of a self-latching pulse amplitude detector very similar to that which is shown as one section of FIG. 1. In the figure, there is shown a comparator means 150, a gate means 160, and means 170 for providing a reset signal. This detector circuit is designed to detect the peak voltage of an input pulse signal SIG relative to the voltage of an externally provided standard signal STD and to provide a resettable self-latched binary output signal Y on lead 156 as a consequence of that detection. Comparator means 150, typically a latchable voltage comparator, is used for detecting the peak voltage of input pulse signal SIG, which is coupled over lead 152 to the "+" input terminal relative to the voltage of the standard signal STD which is coupled over lead 154 to the "−" input terminal. Comparator means 150 provides complementary first and second binary output signals Y, $\overline{Y}$ at output terminals Q, $\overline{Q}$, respectively. Y and $\overline{Y}$ indicate the results of comparing of the SIG and STD signals applied to the "+" and "−" terminals of the comparator means 150, respectively. A latch control input terminal L is also provided to receive a latch control input signal, such as signal X, which enables latching of output signals Y and $\overline{Y}$ when X is at a logic "0" level and allows the comparator function to take place when X is at a logic "1" level.

Gate means 160 performs Exclusive/Or logic with respect to signals coupled to input terminals A and B, providing latch control signal X at its output terminal C. Signal X is connected over lead 162 to the latch control input L of comparator means 150. Typically, gate means 150 is an Exclusive/Or gate. If like signals are applied to terminals A and B, signal X is at logic "0". If unlike signals are applied, signal X is at logic "1".

Reset signal R, coupled to terminal B from means 170 over lead 166, is controlled by an external command signal symbolized by COMD. Typically, means 170 is a one-shot multivibrator, a circuit well known in the art. Logic signal R going from a logic "0" level to a logic "1" level for some reset interval, T, typically greater than 5 nanoseconds, while signal $\overline{Y}$ applied to terminal A remains at a logic "0" level, will cause X to go from a "0" level to a "1" level. This, in turn, will cause comparator means 150 to unlatch the outputs Y, $\overline{Y}$ on terminals Q and $\overline{Q}$, respectively, after the reset interval. After this has occurred, comparator means 150 is once again ready to detect the input signal level. In other words, the self-latching pulse amplitude detector of FIG. 2 at this point is now reset and ready to accept the next input pulse.

Figure 3A:
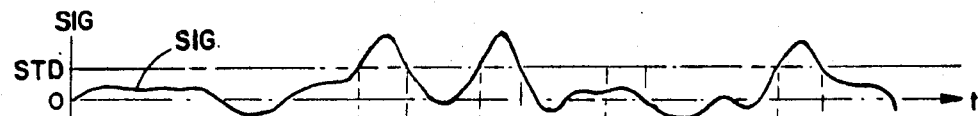
FIGS. 3a through 3f are signal waveforms corresponding to typical signals at various points in the circuit of FIG. 2 during operation of the circuit according to the present invention.
Figure 3B:
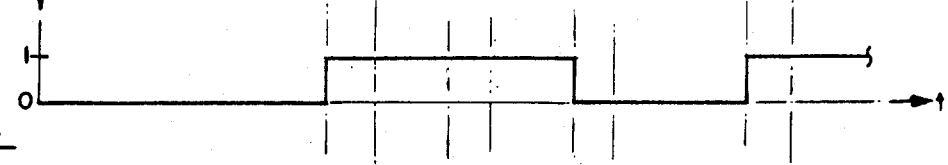
Figure 3C:
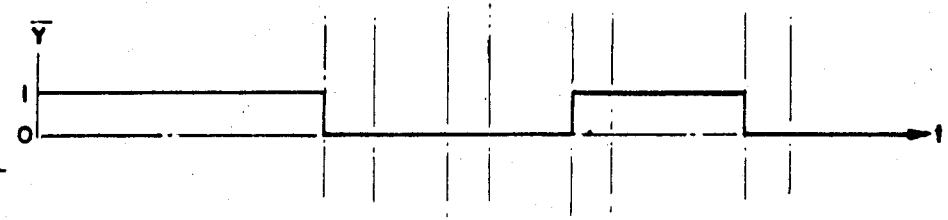
Figure 3D:
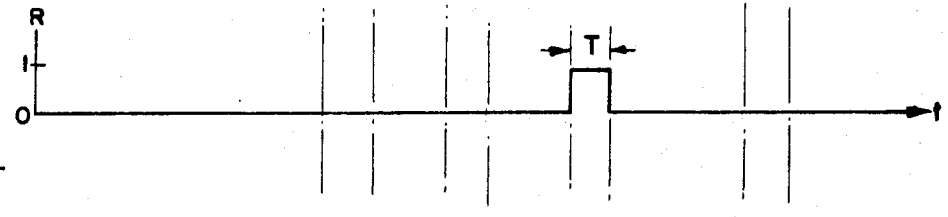
Figure 3E:
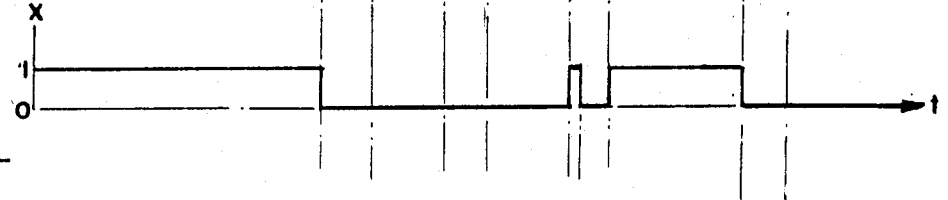
Figure 3F:
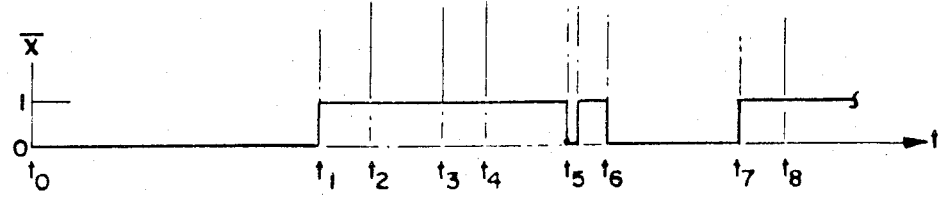

FIGS. 3a through 3f are waveforms of signals related to operation of the circuit of FIG. 2 for a typical pulse detection sequence including the detection, latching, and resetting sequence. In FIG. 3a, standard signal STD is indicated by the horizontal dashed line at level STD. Input signal SIG is indicated by the irregular solid line. Output signals Y and $\overline{Y}$ provided at output terminals Q and $\overline{Q}$, respectively, are indicated by the waveforms of FIGS. 3b and 3c. The waveform of reset signal R provided by means 170 to input terminal B of gate means 160 over lead 166 is shown in FIG. 3d. Gate means 160, typically an Exclusive/Or gate, performs exclusive/or logic with respect to input signals $\overline{Y}$ and R applied to input terminals A and B, respectively, such that like logic levels on A and B produce a signal X taking on a logic "0" level at an output terminal C, and unlike logic levels on A and B produce a logic "1" level at terminal C. The signal $\overline{X}$ at output terminal $\overline{C}$ is the logical complement of the signal X which appears at terminal C. Waveforms of X and $\overline{X}$ are shown in FIGS. 3e and 3f, respectively.

During the time interval t=t₀ to t=t₁, the levels of $\overline{Y}$ and R are unlike, producing a logic "1" level for X as shown in FIG. 3e. At time t=t₁, the uppermost waveform shows that signal SIG begins to exceed standard signal level STD. Consequently, the logic levels of Y and $\overline{Y}$ change, outputting, respectively, a logic "1" level at terminal Q and a logic 0 level at terminal $\overline{Q}$. This change in the signal level of $\overline{Y}$ while the level of reset signal R on lead 166 remains unchanged, causes the output signal X on terminal C to change state to level "0" as shown in FIG. 3e. With a logic "0" level applied to the latch control input terminal L over lead 162, the Y output of comparator means 150 is latched to its then existing state. For this example, Y becomes latched in a logic "1" condition and $\overline{Y}$ is latched in a logic "0" condition.

At time t=t₂, the input signal SIG is shown to begin falling below the STD level. However, because Y and $\overline{Y}$ are latched in the state they were in prior to t₂, Y stays in the logic "1" level and $\overline{Y}$ stays in logic "0" level beyond time t₂ up until time t₅, whereupon reset signal R goes from a logic "0" to a logic "1" condition to initiate the reset sequence.

Note that between time t=t₃ and t=t₄, input signal SIG once again exceeds the STD level. This occurrence has no effect on the state of Y and $\overline{Y}$ because the comparator is latched and it ignores any variations on the input until after the circuit has been reset.

At time t=t₅, the reset signal R from means 170 changes state from the "0" to the "1" level. As this takes place at the B input to gate means 160, the A input remains momentarily at "0" until the effect of a change in X unlatches the outputs Y and $\overline{Y}$ of the comparator means 150. This allows outputs Y and $\overline{Y}$ to follow the state of comparison then existing at the "+" and "−" inputs to the comparator means 150. If, at the time t₅ that the unlatching signal occurs, the input signal SIG happens to be less than the standard level STD, then the output Y from the comparator means 150 will drop to a logic "0" level and concurrently the $\overline{Y}$ signal will change to the logic "1" level. At this point then, assuming that the pulse width of the reset signal, i.e., reset interval T=t₆−t₅, is longer than the time interval for this feedback action to take place, gate means 160 then sees like signals at both inputs for the duration of the reset pulse such that output X falls to "0" during this time.

At time t=t₆, reset signal R changes from the logic "1" to the logic "0" level. Once again, the inputs $\overline{Y}$ and R at terminals A and B of gate means 160 become unlike, and therefore, output signal X once again changes to the logic "1" level and remains at that level until t=t₇.

At time t=t₇, input signal SIG again exceeds the level STD and causes Y to change to the logic "1" level. The response of the remainder of the circuit is identical to that which took place at time t=t₁ wherein signals Y and $\overline{Y}$ are now latched until a later reset pulse is applied to gate means 160.

In some configurations it is desirable to have a second latch control input to comparator 150 which is adapted to accept the logical complement of the signal applied to L. This input is shown as complementary latch control input terminal $\overline{L}$ in FIG. 2. Correspondingly, a logical complement $\overline{X}$ of the output signal X of gate means 160 is output at terminal $\overline{C}$, such that $\overline{X}$ can be applied to the input $\overline{L}$ to enhance the latching function of the comparator means 150. FIG. 3f shows a typical $\overline{X}$ waveform which is present on lead 164 connecting input terminal $\overline{C}$ of Exclusive/Or gate 160 to the $\overline{L}$ input of comparator means 150. Also shown in FIG. 2 are terminals H and G which are connected to an external power source providing a supply voltage $V_s$ and a reference voltage $V_r$. The reference voltage $V_r$ is typically at ground level.

A key feature to be noted here is the self-latching characteristic of this circuit. Exclusive/Or gate 160 functions such that when like logic signal levels are applied to terminals A and B, output X at terminal C will go to a logic "0" state and output $\overline{X}$ at terminal $\overline{C}$ will go to a logic "1" state. Therefore, if $\overline{Y}$ and R which are applied to terminals A and B, respectively, on leads 158 and 166, both go to a logic "0" state then X will go to a logic "0" state and $\overline{X}$ will go to a logic "1" state. X at logic "0" will cause comparator 150 to latch output Y and $\overline{Y}$ in whatever state they happen to be in at that moment. This condition will continue until there is a change in X. A change in X will come about only if the signals applied to terminals A and B are changed to unlike logic states. Such a condition is induced by the reset signal R going from a logic "0" state to a logic "1" state such as at time t₅ where signal R goes to a "1" state and $\overline{Y}$ remains in the "0" state thereby causing X to change states. At t=t₅, X goes to a logic "1" state and $\overline{X}$ goes to a logic "0" state. Signal X going to a "1" state causes the output of comparator means 150 to be unlatched and reset to accept the next input pulse which exceeds standard signal level STD. An example of this is shown at time t₇ where input signal SIG is shown once again exceeding the STD level thereby triggering the latching sequence in the manner of the earlier part of the waveforms.

Referring to FIG. 1, it is seen that the digital peak detector shown there is a parallel collection of circuits such as is shown in FIG. 2 with the additional constraint that the parallel arrangement is done such that the standard signal STD is shown in FIG. 2 is now substituted by a signal which is typically a different DC level at each of the "−" inputs of the comparators and the same input signal is applied to each of the "+" terminals. For each section in which the input signal exceeds the signal applied to the "−" input of the comparator, a self-latched logic "1" level will be provided at the corresponding output terminal such as terminals 66, 86, and 106. Those comparators for which the input signals does not exceed the STD level will output a logic "0" level. Additionally, for those input signals SIG in which a logic "1" signal is output, the comparator output signals Y, $\overline{Y}$ will be automatically latched until a reset signal is applied to the respective Exclusive/Or gates via leads 38, 108, 88, and 68 from reset signal input terminal 36. Therefore, it can be seen that as the time history of an input pulse increases in amplitude, each of the 6 sections which are shown will in turn provide a latched positive output until the maximum or peak level of the input signal is reached. At that point all of the sections whose reference standard signals have been exceeded will have a latched logic "1" at their outputs and those which have not been exceeded will provide a logic "0" output. In this fashion, a direct digital peak indication is provided of the amplitude of analog input pulse SIG applied at terminal 30. Using standard encoding techniques, those skilled in the art can transform the 31 individual output signals to a desired binary code output.

It is to be noted that the above description relates to the detection and latching of input pulse signals which exceed the standard signal level STD in a positive going sense. The output from the comparator is indicated as logic "1" when the input signal SIG is greater in a positive sense than the standard signal level. It is also noted that the reset signal is a positive going pulse. Negative going pulses can also be detected in the same manner using the same circuitry. To detect negative pulses, one needs only to change the sense of the reset signal R on lead 166 of FIG. 2 to go from a logic "1" to a logic "0" during the reset interval, T, and then back again to a logic "1" level after the reset pulse. To detect negative going signals, signal "SIG" on lead 152 would be normally greater than signal "STD" on lead 154. $\overline{Y}$ would be "0" and Y would be "1". The Exclusive/Or outputs, X and $\overline{X}$ would be "0" and "1", respectively, and the comparator 150 becomes unlatched. If SIG becomes less than STD, $\overline{Y}$ goes to "1", latching the comparator 150. Reset signal R going from "1" to "0" and back to "1" will unlatch the comparator allowing detection.

Figure 4:
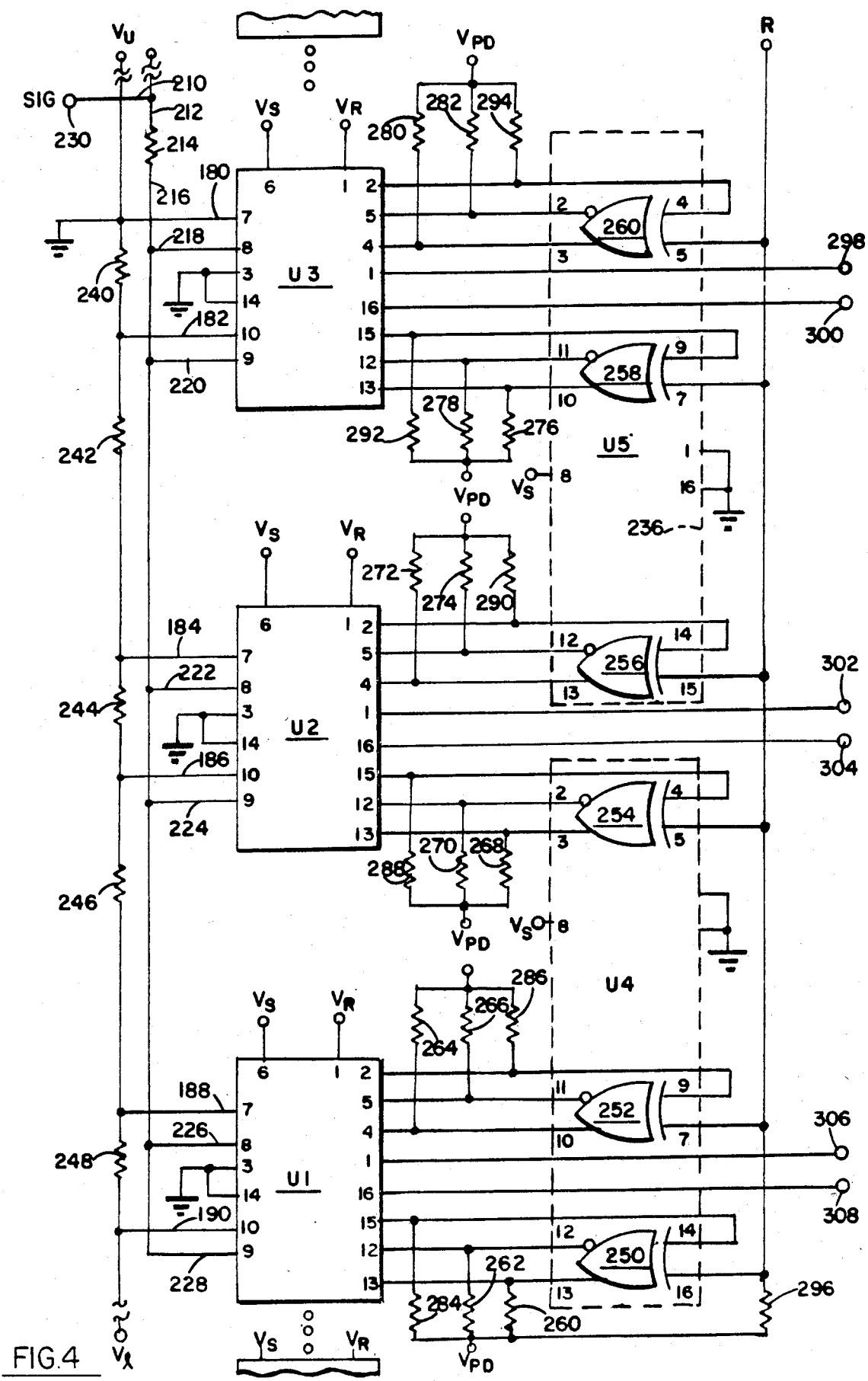
FIG. 4 is a schematic diagram of a portion of a 1 of 31 unary high-speed digital peak detector of the present invention corresponding to the block diagram of FIG. 1.

FIG. 4 presents a schematic diagram of a portion of an embodiment of the present invention. Elements U1, U2, and U3 are each ultra-fast dual comparators, which are Plessey SP 9687 type in a typical application. Elements U4 and U5 are triple 2-input Exclusive "Or"/Exclusive "Nor" gates. Typically, these are Motorola MC10107 type devices. The input signal SIG is applied to terminal 230 and passes over leads 210, 212, through resistor 214, over leads 216, 218, 220, 222, 224, 226, and 228, to the "+" terminal of each comparator. Resistors 240, 242, 244, 246, and 248, comprise part of the ladder divider network which provides the necessary standard signals via leads 180, 182, 184, 186, 188, and 190 against which the input signal SIG is compared. Voltages $V_u$, and $V_1$, provide the necessary voltage difference across which the divider is connected to provide the standard signals on the respective "−" terminals of the differential comparators. Each of the comparator chips U1–U3 is also connected to $V_S$ and $V_R$ voltage supply and voltage reference signals which power the chip. $V_S$ and $V_R$ are typically at −5.2 and +5 VDC, respectively. On the output side there are shown 6 of the 31 representative unary outputs at terminals 298, 300, 302, 304, 306, and 308. The Exclusive/Or gates comparable to gates 60, 80, and 100 of FIG. 1 and to gate means 160 of FIG. 2, are shown as Exclusive/Or gates 250, 252, 254, 256, 258, and 260. These gates are all dual input gates. Also shown in this implementation are pull-down resistors 260, 262, 264, 266, 268, 270, 272, 274, 276, 278, 280, and 282. These resistors, on the order of 50 ohms, are returned to potential, $V_{PD}$, typically at −2 VDC. Also shown are pull-down resistors 284, 286, 288, 290, 292, and 294, which resistances, also typically 50 ohms, provide the necessary termination for the inverted output from each of the dual-input comparators U1 through U3 and are also returned to $V_{PD}$. Also shown is a resistance 296 at one input to the Exclusive "Or" gate of 250 which is also returned to $V_{PD}$. A reset signal R is supplied at 232 and is a common reset signal supplied to the second input of each of the Exclusive "Or" gates 250 through 260. Each of the Motorola MC 10107's comprises three Exclusive "Or" gates shown enclosed by dashed lines 234 and 236. U4 is indicated by dashed line 234 and U5 is indicated by dashed line 236.

Another embodiment of the present invention is a method of comparing the peak voltage level of narrow pulses of an input analog signal SIG, such as shown in FIG. 3a and as is applied to the "+" terminal of comparator 150 of FIG. 2, relative to the level of a standard voltage signal STD, such as shown in FIG. 3a and as is applied to the "−" terminal of comparator 150 of FIG. 2, to produce a self-latching output Y, such as on lead 156, and quickly unlatching signal Y upon command, such as by action of reset signal R from means 170 for providing a reset signal, comprising the following steps: providing a latchable voltage comparator 150, such as shown in FIG. 2, having first and second differential input terminals, such as terminals "+" and "−", input terminals for latch control, such as terminals L and $\overline{L}$, and first and second output terminals, such as terminals Q and $\overline{Q}$, all shown in FIG. 2; applying the input analog signal, SIG, to the first differential input terminal "+"; applying the standard signal STD to the second differential input terminal "−"; producing a binary output signal and its complement, such as Y and $\overline{Y}$, respectively, at first and second output terminals, such as Q and $\overline{Q}$, respectively, of the comparator 150 corresponding to the differential comparison of the peak voltage level of pulses of the input analog signal SIG with the level of the standard signal STD; coupling the logical complement $\overline{Y}$ of the comparator binary output to a first input terminal A of Exclusive/Or gate 160 of FIG. 2; coupling an external reset command R to a second input terminal B of the Exclusive/Or gate 160; performing an exclusive/or logic operation with respect to signals $\overline{Y}$ and R on terminals A and B, respectively, and providing an Exclusive/Or output logic signal X, corresponding thereto; coupling X to the input terminal L for latch control on the voltage comparator 150 in such polarity phase as to provide for self-latching of the comparator binary output signal Y in a logic "1" state if the input pulse exceeds the level of the standard voltage signal STD; releasing the latched comparator binary output signal Y in response to the external reset command signal R by effecting a change in the Exclusive/Or output logic signal X from a latching state to an unlatching state.

A further embodiment of a method for comparing the peak voltage level of an input analog pulse signal relative to the level of a standard voltage signal in accordance with the apparatus described with reference to FIGS. 2 and 3a hereinabove, to produce a self-latching output and, subsequently, in response to external command, unlatching that output in a time period comparable to the pulse width of the analog pulse signal, comprises the steps of: comparing the amplitude of an input analog pulse signal, such as signal SIG shown in FIG. 3a and which is applied to the "+" terminal of differential comparator 150, with a standard voltage signal, such as signal STD shown in FIG. 3a and which is applied to the "−" terminal of the comparator 150, to produce a binary output signal and its logical complement, such as Y and $\overline{Y}$ on leads 156 and 158, characterizing the comparison of the input and standard signals; generating a binary reset signal, such as signal R on lead 166, responsive to external control, such as the COMD signal in FIG. 2; exclusive/or-ing the logical complement, such as $\overline{Y}$, of the binary output signal, such as Y, with a binary reset signal, such as signal R, to develop an output latch control signal, such as signal X shown on lead 162; self-latching the binary output and complement signals, such as Y and $\overline{Y}$ of comparator 150, in response to the output latch control signal, such as signal X; and releasing the self-latched binary output signals, such as Y and its logical complements $\overline{Y}$, by momentarily reversing the logic state of the reset signal, such as signal R in response to external control signal COMD.

Although the invention has been described and illustrated in detail, it is clearly understood that the same is by way of illustration only and is not to be taken by way of limitation, the spirit and scope of this invention being limited only by the terms of the appended claims.

What is claimed is:

1. A self-latching pulse amplitude detector for detecting a peak voltage level of an input pulse signal relative to a voltage of an externally provided standard signal, and for providing a resettable self-latched binary output signal corresponding thereto, comprising:
   comparator means for detecting said peak voltage level of said input pulse signal coupled thereto relative to a voltage of a standard signal coupled thereto, and for providing corresponding complementary first and second binary output signals therefrom, said comparator means having a first latch control input terminal;
   means for providing a reset signal;
   gate means having first and second input terminals for performing Exclusive/Or logic with respect to said second binary output signal coupled to said first input terminal and said reset signal coupled to said second input terminal, and for providing a corresponding first logic output signal resulting therefrom;
   said corresponding first logic output signal being coupled to said first latch control input terminal of said comparator means for latching the first and second binary output signals from said comparator means when said peak voltage of said input pulse signal exceeds the voltage of said standard signal and thereafter unlatching said binary output signals in response to said reset signal, said first binary output signal thereby being a resettable self-latched binary output signal corresponding to the amplitude of said input pulse signal relative to the voltage of said standard signal.

2. The detector of claim 1, wherein:
   said gate means further providing a second logic output signal which is a logical complement of said first logic output signal; and
   said comparator means further having a second latch control input terminal to which is coupled said second logic output signal from said gate means.

3. The detector of claim 1, wherein said comparator means comprises a latchable voltage comparator having differential inputs, complementary outputs, and complementary latch function inputs.

4. A self-latching pulse amplitude detector circuit for detecting an amplitude of an analog input signal relative to an externally provided standard voltage and for providing a self-latched binary output signal corresponding thereto, said circuit operating from a voltage supply providing supply and reference voltage levels at supply and reference terminals, respectively, comprising:
   a latchable differential voltage comparator having first and second comparator input terminals, first and second comparator output terminals, and first and second latch function input terminals;
   said analog input signal coupled to said first comparator input terminal;
   said standard voltage to be compared with said analog input signal coupled to said second comparator input terminal;
   an Exclusive/Or gate having first and second gate input terminals, said first gate input terminal connected to said second comparator output terminal and having first and second gate output terminals connected to said first and second latch function input terminals, respectively; and
   means coupled to said second gate input terminal for providing a reset signal thereto to cause said self-latching pulse amplitude detector circuit to reset upon external command;
   said self-latched binary output signal being provided at said first comparator output terminal.

5. A high-speed digital peak detector for determining a peak voltage of an input analog signal and for providing a 1 of N unary digital outputs corresponding thereto, where N is a positive integer, said detector comprising:
   a plurality of N self-latching voltage detectors, each detector comprising a latchable differential voltage comparator and an Exclusive/Or gate, each of said comparators and gates having first and second input terminals and first and second output terminals and each of said comparators further having first and second latch function input terminals, the second output terminal of each of said comparators connected to the first input terminal of a corresponding one of said gates, and the first and second output terminals of said corresponding one of said gates connected respectively to the first and second latch function input terminals of said corresponding one of said comparators;
   means coupled to the second input terminal of each of said gates for providing a reset signal thereto; and
   means coupled to the second input terminal of each of said comparators for maintaining a standard voltage thereon, a step difference from one said standard voltage to the next which is substantially equal to a 1/(N+1) part of an entire expected range of said input analog signal;
   said analog input signal being applied in parallel to said first input terminal of each of said comparators;
   a 1 of N unary digital output being provided collectively at the first output terminals of each of said N comparators corresponding to the peak voltage of said input analog signal.

6. Apparatus for comparing a peak voltage level of an input analog pulse signal relative to a level of a standard voltage signal to produce a self-latching output and, subsequently, in response to an external command signal unlatching said output in a time period comparable to a pulse width of the input analog pulse signal, comprising:

means for comparing an amplitude of said input analog pulse signal, with said standard voltage signal to produce a binary output signal and a logical complement of said binary output signal characterizing the comparison of said input and standard signals;

means for generating a binary reset signal responsive to said external command signal;

means for exclusive/or-ing said logical complement of said output binary signal with said binary reset signal to develop an output latch control signal;

means for self-latching said binary output signals in response to said output latch control signal; and means for releasing said self-latched binary output signal and its logical complement by momentarily complementing said reset signal in response to said external command signal.

7. A method of comparing a peak voltage level of narrow pulses of an input analog signal relative to a level of a standard voltage signal to produce a self-latching output and, upon command, unlatching therefrom in a period comparable to a pulse width of the input analog signal, comprising the steps of:

providing a latchable voltage comparator having first and second differential input terminals, input terminals for latch control, and first and second output terminals;

applying said input analog signal to said first differential input terminal;

applying said standard signal to said second differential input terminal;

producing a binary output signal and its complement at first and second output terminals, respectively, of said comparator corresponding to the differential comparison of said peak voltage level of pulses of said input analog signal with said level of said standard voltage signal;

coupling the complement of said comparator binary output signal to a first input terminal of an Exclusive/Or gate;

coupling an external reset command signal to a second input terminal of said Exclusive/Or gate;

performing an Exclusive/Or logic operation with respect to said signals on said first and second input terminals of said Exclusive/Or gate and providing an Exclusive/Or output logic signal corresponding thereto;

coupling said Exclusive/Or output signal to said input terminals for latch control on said voltage comparator in such polarity phase as to provide for self-latching of said comparator binary output signal in a logic "one" state if said peak voltage level of said input analog signal exceeds the level of said standard voltage signal;

releasing the latched comparator binary output signal in response to said external reset command signal by effecting a change in said Exclusive/Or output logic signal from a latching state to an unlatching state.

8. A method of comparing a peak voltage level of an input analog pulse signal relative to a level of a standard voltage signal to produce a self-latching output and, subsequently, in response to an external command signal, unlatching said output in a time period comparable to a pulse width of the input analog pulse signal, comprising the steps of:

comparing an amplitude of said input analog pulse signal with said standard voltage signal to produce a binary output signal and its logical complement characterizing the comparison of said input and standard signals;

generating a binary reset signal responsive to said external command signal;

exclusive/or-ing the logical complement of said output binary signal with said binary reset signal to develop an output latch control signal;

self-latching said binary output signal and its complement in response to said output latch control signal; and releasing said self-latched binary output signal and its logical complement by momentarily complementing said reset signal in response to said external command signal.

* * * * *